US008659258B2

(12) United States Patent
Donner et al.

(10) Patent No.: US 8,659,258 B2
(45) Date of Patent: Feb. 25, 2014

(54) METHOD FOR OPERATING A BRUSHLESS MOTOR

(75) Inventors: Andreas Donner, Frankfurt (DE); Christian Gunselmann, Wuppertal (DE)

(73) Assignee: Continental Automotive GmbH (DE)

( * ) Notice: Subject to any disclaimer, the term of this patent is extended or adjusted under 35 U.S.C. 154(b) by 74 days.

(21) Appl. No.: 13/146,738

(22) PCT Filed: Jan. 13, 2010

(86) PCT No.: PCT/EP2010/050354
§ 371 (c)(1),
(2), (4) Date: Jul. 28, 2011

(87) PCT Pub. No.: WO2010/086227
PCT Pub. Date: Aug. 5, 2010

(65) Prior Publication Data
US 2011/0285334 A1  Nov. 24, 2011

(30) Foreign Application Priority Data

Jan. 28, 2009  (DE) .......................... 10 2009 000 448

(51) Int. Cl.
*G05B 11/28*  (2006.01)
(52) U.S. Cl.
USPC .......................................................... 318/599
(58) Field of Classification Search
USPC ........ 318/565, 490, 432, 434; 361/18, 23, 31, 361/88, 79
See application file for complete search history.

(56) References Cited

U.S. PATENT DOCUMENTS

| 7,612,576 | B1 * | 11/2009 | Heller et al. ............. 324/765.01 |
| 2004/0085087 | A1 | 5/2004 | Zehentner |
| 2011/0019452 | A1 * | 1/2011 | Shinomoto et al. ........... 363/126 |
| 2011/0248108 | A1 * | 10/2011 | Carriere ......................... 241/33 |

FOREIGN PATENT DOCUMENTS

| DE | 112004002642 | 11/2006 |
| EP | 1387459 | 2/2004 |
| EP | 1959561 | 8/2008 |
| GB | 2409905 | 7/2005 |

OTHER PUBLICATIONS

International Search Report issued in PCT/EP2010/050354 filed Jan. 13, 2010, mailed Jun. 1, 2010.

* cited by examiner

*Primary Examiner* — Shawki Ismail
*Assistant Examiner* — Zoheb Imtiaz
(74) *Attorney, Agent, or Firm* — RatnerPrestia

(57) ABSTRACT

The present invention relates to a method for operating a brushless electric motor whose windings are driven by an inverter with the aid of six switches, having an identification unit being provided in order to identify defective switches, a unit for voltage measurement at the outputs of the inverter, and a microcontroller for controlling the switches. Particularly in safety-relevant applications, it is important to quickly determine what characteristic the defective switch has, for example in order to continue to operate the electric motor in an emergency mode, or to switch it off immediately. The defect ($F_1, F_2, F_3$) is traced and the nature of the defect ($F_1, F_2, F_3$) in a switch determined by using a different voltage ($PWM_1, PWM_2$) to drive those windings (V, W) which are not associated with the defective switch, while a voltage measurement is carried out on the winding (U) associated with the defective switch.

12 Claims, 5 Drawing Sheets

METHOD FOR OPERATING A BRUSHLESS MOTOR

CROSS REFERENCE TO RELATED APPLICATIONS

This application is the U.S. national phase application of PCT International Application No. PCT/EP2010/050354, filed Jan. 13, 2010, which claims priority to German Patent Application No. 10 2009 000 448.3, filed Jan. 28, 2009, the contents of such applications being incorporated by reference herein.

FIELD OF THE INVENTION

The present invention relates to a method for operating a brushless electric motor whose windings are driven by an inverter with the aid of six switches, with an identification unit being provided in order to identify defective switches, with a unit being provided for voltage measurement at the outputs of the inverter, and with a microcontroller being provided for controlling the switches.

BACKGROUND OF THE INVENTION

In general, inverters for driving brushless motors have six switches. After a defect, each switch may in principle have two different characteristics: switched off, that is say blocked in the open switch position, or switched on, that is to say blocked in the closed switch position. A switched-on defective switch is also referred to in the art as a short. Particularly in safety-relevant applications, it is then important to determine very quickly what type of defect is present, in order to continue to operate the electric motor in an emergency mode, or to switch it off immediately.

Frequently, current sensors are used by means of which the current in the individual motor phases or the total current can be measured. Although current sensors make it possible to distinguish between switched-on defective switches and switched-off defective switches, and thus to determine the type of defect, the costs for the current sensors must, however, be taken into account. Alternatively, the electric motor can always be switched off when a switch defect occurs. No emergency mode is then possible.

DE 11 2004 002 642 T5, which is incorporated by reference, discloses a plausibility check for an electrical three-phase system. In order to identify defects reliably, the phase currents are measured. In order to avoid confusion between the phase currents, a current vector is also observed. Comparatively expensive current sensors are therefore required to carry out the abovementioned method.

SUMMARY OF THE INVENTION

Therefore, the present invention is based on the object of ensuring that the defect type is determined quickly and at low cost, without using current sensors.

In this case, the winding which is affected by the defect is traced and the nature of the defect in the switches is determined by using a different voltage to drive those windings which are not associated with the defective switch, while a voltage measurement is carried out on the winding which is associated with the defective switch. The type of defect is a switch which is blocked in the open or closed switch position.

Therefore, in one preferred development of the method according to aspects of the invention, the winding (U) which is associated with the defective switch (13, 16) is connected to the unit (B) for voltage measurement. The following steps are envisaged in the method according to aspects of the invention:
identification of a defective switch by the identification unit;
opening of all the switches;
driving the windings which are not associated with the defective switch with different voltages and
measurement and evaluation of the voltage which is applied to the winding which is associated with the defective switch.

In this case, it is envisaged that a winding which is not associated with the defective switch has a pulse-width-modulated voltage applied to it, which has a duty ratio of 1/3=33%, while the other winding which is likewise not associated with the defective switch has a pulse-width-modulated voltage applied to it which has a duty ratio of 2/3=66%.

The switch is identified as defective in the open switch position if the measurement result of the pulse-width-modulated voltage on the winding which is associated with the defective switch indicates a duty ratio between 33% and 66%.

Furthermore, the switch is identified as being defective in the closed switch position with a connection to the positive supply voltage if the measurement result of the pulse-width-modulated voltage on the winding which is associated with the defective switch indicates a duty ratio of 100%.

In the case of a further defect type, the switch is identified as defective in the closed switch position with a connection to the negative supply voltage if the measurement result of the pulse-width-modulated voltage on the winding which is associated with the defective switch indicates a duty ratio of 0%.

In one particularly advantageous development of the method according to aspects of the invention, two other windings are driven, and the described method steps are then repeated until the defect has been traced or a multiple fault is identified, in which a plurality of switches are defective. The method steps are thus repeated, with different windings being driven, until the defect has been traced or a multiple fault is identified.

A further advantageous development of the method according to aspects of the invention provides that the defective switch is opened by deliberate thermal overloading in the situation in which the defective switch is blocked in the switched-on state. Alternatively, a fuse is blown if the defective switch is blocked in the closed switch position. The electric motor can then be operated in an emergency mode. In principle, the electric motor can be operated in an emergency mode if a defective switch is in the switched-off state.

BRIEF DESCRIPTION OF THE DRAWINGS

The invention will be explained in more detail in the following text with reference to one exemplary embodiment and in conjunction with the attached drawing, in which.

DETAILED DESCRIPTION OF THE PREFERRED EMBODIMENTS

Figure 1:
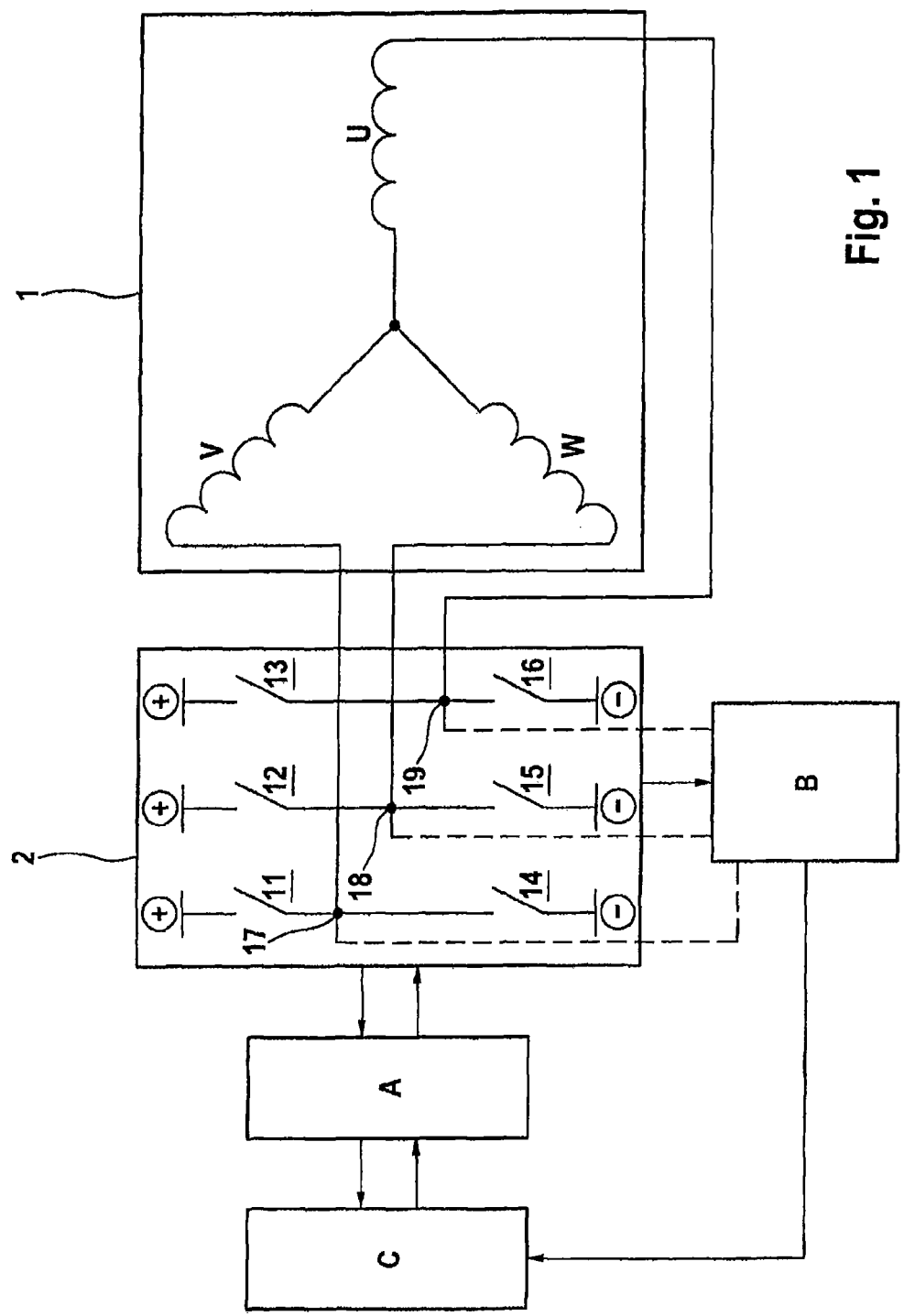
FIG. 1 shows a schematic outline illustration of the windings of a brushless electric motor and of an inverter on which the method according to aspects of the invention can be carried out.

FIG. 1 schematically illustrates a brushless electric motor 1 whose windings U, V, W are driven by an inverter 2. For this purpose, the inverter 2 has six switches 11, 12, 13, 14, 15, 16, with the upper switches 11, 12, 13 in FIG. 1 being associated with the positive supply voltage, and with the lower switches 14, 15, 16 in FIG. 1 being associated with the negative supply voltage. By way of example, the switches 11 and 14 therefore supply the winding V with a suitable supply voltage. As can also be seen from FIG. 1, there are tapping points 17, 18, 19 between the switches 11, 12, 13, which are associated with the positive supply voltage, and the switches 14, 15, 16, which are associated with the negative supply voltage, at which tapping points 17, 18, 19 the voltage across the windings U, V, W is tapped off and is supplied to a unit B for voltage measurement. The measurement results from the unit B for voltage measurement are supplied to a microcontroller C, which on the one hand controls the switches 11, 12, 13, 14, 15, 16, and on the other hand evaluates the information produced by the voltage measurement unit B. In addition, an identification unit A is provided, for identification of defective switches 11, 12, 13, 14, 15, 16. The information produced by the identification unit A is likewise supplied to the microcontroller C, for evaluation.

In one embodiment, in practice, the switches 11, 12, 13, 14, 15, 16 are formed by semiconductor switches, to be precise transistors or MOSFETs. In practice, the identification unit A is in the form of a bridge driver which applies a voltage to the switches 11, 12, 13, 14, 15, 16, which are in the form of transistors, and checks whether the switch position of the transistor changes. The unit B for voltage measurement of the tapping points 17, 18, 19 is in practice in the form of a voltage divider, and determines the duty ratio of a pulse-width-modulated voltage. In this case, the duty ratio corresponds to the quotient of the pulse duration and the period duration.

In principle, each switch 11, 12, 13, 14, 15, 16 may have two different types of defect that is to say, after a defect, it is in principle in one of the two states described below: defectively switched off, that is to say blocked in the open switch position, or defectively switched on, that is to say blocked in the closed switch position. A switched-on defective switch 11, 12, 13, 14, 15, 16 is also referred to in the art as a short.

Particularly in safety-relevant applications, it is important to very quickly trace the defect and to determine what type of defect is present, in order to continue to operate the electric motor 1 in an emergency mode, or to switch it off immediately. In the situation in which the switch 11, 12, 13, 14, 15, 16 is in the "defectively switched on" state, the switch 11, 12, 13, 14, 15, 16 can be opened by deliberate thermal overloading, in order to allow emergency operation of the electric motor 1. Alternatively, a fuse can be blown, if the defective switch 11, 12, 13, 14, 15, 16 is blocked in the switched-on state. Emergency operation is possible only if a switch 11, 12, 13, 14, 15, 16 is in the "not switched on" defective state, or the short is cancelled out by a switch that is blocked in the switched-on state.

Figure 2:
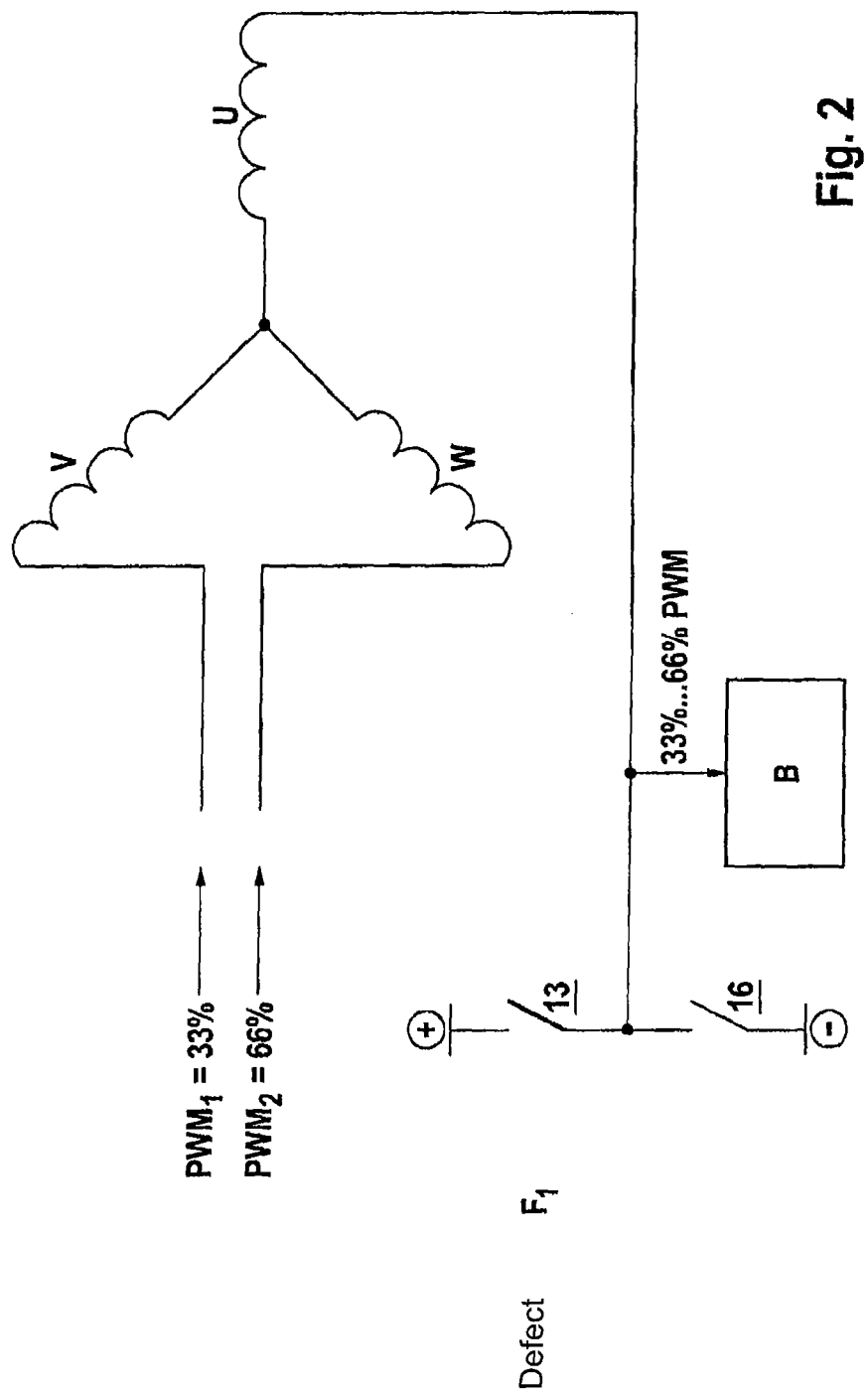
FIG. 2 shows a schematic illustration of the windings from FIG. 1 and a first defect type $F_1$, in which the defective switch is switched off.

FIG. 2 shows the defect $F_1$ in the switch 13: the switch 13 is defectively switched off, that is to say the switch 13 is blocked in the open switch position. The defective switch 13 is associated with the winding U of the electric motor 1. That is to say, the following procedure is now used to trace the defect $F_1$ and to determine the type of defect, that is to say defectively switched on or defectively switched off: first of all, the identification unit A identifies a defective switch 11, 12, 13, 14, 15, 16. However, the identification unit A cannot identify which of the switches 11, 12, 13, 14, 15, 16 is defective, and the following method is therefore carried out repeatedly, as will also be explained in more detail in the following text with reference to FIG. 5.

Then, first of all, the drive to the switches 11, 12, 13, 14, 15, 16 is stopped. All the switches 11, 12, 13, 14, 15, 16 are opened, and are therefore changed to the "switched off" state. For this purpose, the microcontroller C evaluates the information from the identification unit A and generates the drive signals required for the "switched off" state. The microcontroller C drives the switches 11, 12, 14, 15 for the two windings V and W which are not associated with the defective switch 13. In this case, the windings V and W are each driven with a pulse-width-modulated voltage, with a different duty ratio. In the situation described in FIG. 2, the winding V is driven with a duty ratio of $PWM_1=1/3=33\%$, while the winding W is driven with a duty ratio of $PWM_2=2/3=66\%$.

A certain amount of time is then allowed to pass in order to determine whether the identification unit A still identifies a defect. In the situation in which the defective switch 11, 12, 13, 14, 15, 16 is associated with one of the driven windings V, W, the identification unit A would once again identify a defect, and would terminate the drive. In a situation such as this, the method described above would be started again, with two different windings U, V, W being driven in the hope of finding the two of the total of three windings U, V, W whose associated switches 11, 12, 13, 14, 15, 16 are not defective.

The unit B for voltage measurement then measures the duty ratio of the pulse-width-modulated voltage across the winding U which is not being driven, and the microcontroller C evaluates this measurement. If the value determined across the winding U is in the range between $PWM_1=33\%$ and $PWM_2=66\%$, then this identifies that the defective switch 13 is defectively switched off, and is associated with the winding U which is not being driven.

Figure 3:
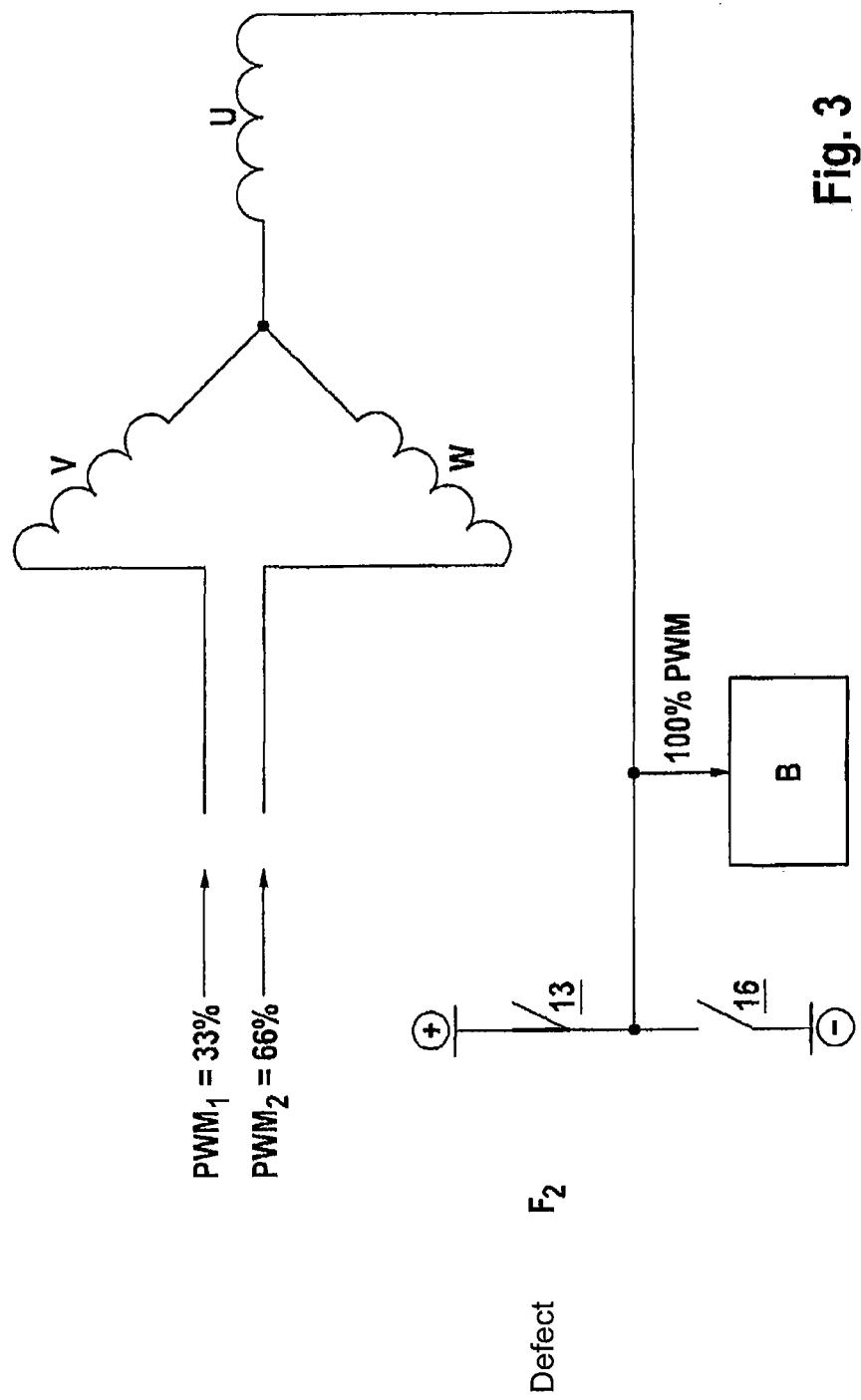
FIG. 3 shows an illustration corresponding to FIG. 2, having a second defect type $F_2$ which is defectively switched on with a connection to the positive supply voltage.

FIG. 3 schematically illustrates a further defect type: In the case of a defect $F_2$, the switch 13 (alternatively 11 or 12) is defectively switched on with a connection to the positive supply voltage. The switch 13, which is associated with the positive supply voltage, is therefore blocked in the closed switch position in the case of defect type $F_2$. Once again, after opening all the switches 11, 12, 13, 14, 15, 16, the two windings V and W which are not associated with the defective switch 13 are driven. The winding V is once again driven with a pulse-width-modulated voltage with a duty ratio of $PWM_1=33\%$, while the winding W is driven with a pulse-width-modulated voltage with a duty ratio of $PWM_2=66\%$. In the situation described in FIG. 3, the unit B measures a voltage across the winding U with a duty ratio of 100%. A measurement result such as this therefore identifies a switched-on defective switch 13 with a connection to the positive supply voltage, which is associated with that winding U which was not driven.

Figure 4:
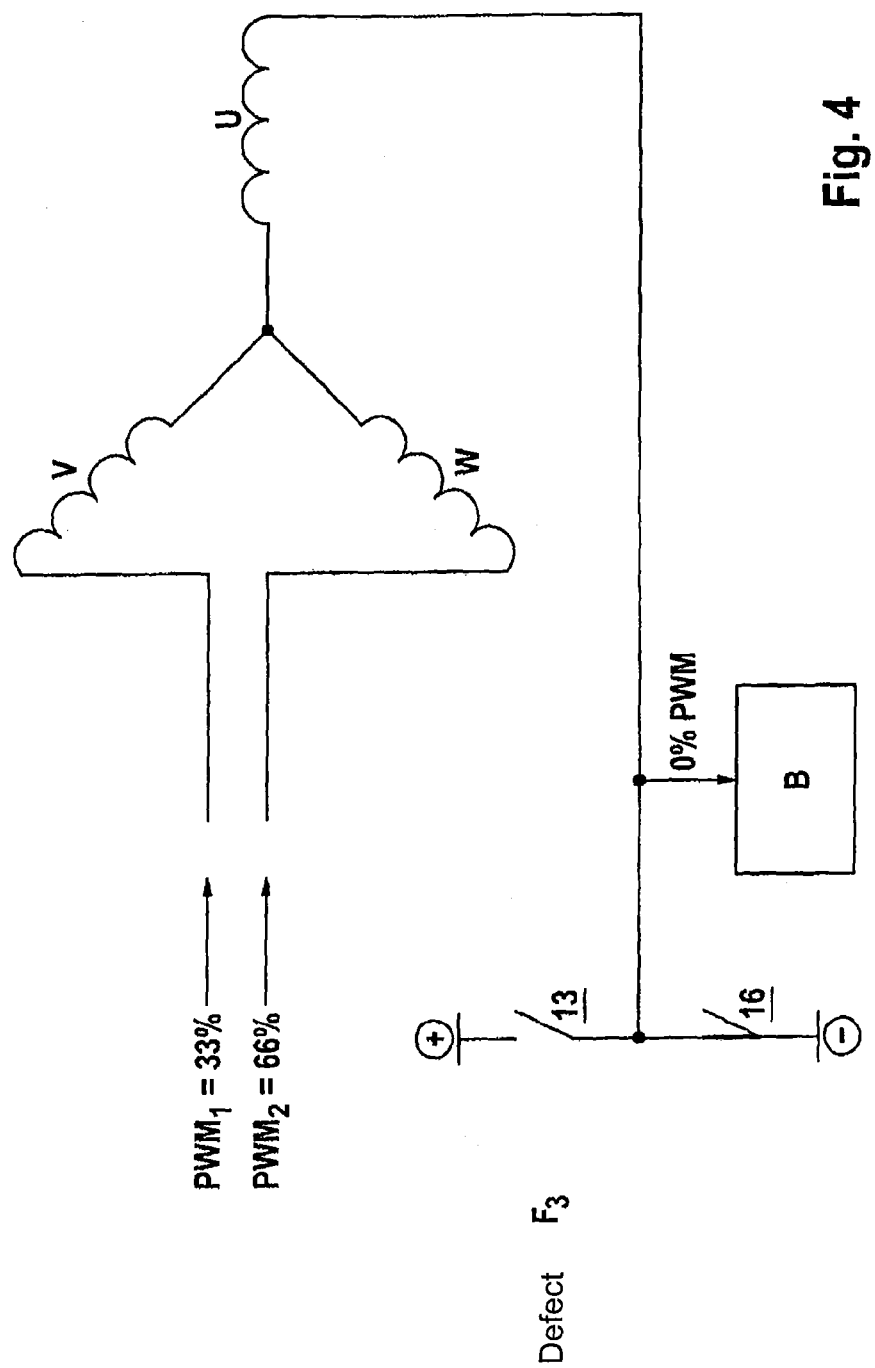
FIG. 4 shows a further illustration, which corresponds to the illustration from FIG. 2, with a third defect type $F_3$ which is defectively switched on with a connection to the negative supply voltage.

The third defect type $F_3$ is illustrated schematically in FIG. 4. This defect type $F_3$ is a switched-on defective switch 16 (alternatively 14 or 15) with a connection to the negative supply voltage. This means that this switch 16 is blocked in the closed switch position with a connection to the negative supply voltage. Once again, a different voltage is applied to the two windings V, W which are not associated with the defective switch 16, to be precise with a pulse-width-modulated voltage with a duty ratio of $PWM_1=33\%$ being applied to the winding V, and with a pulse-width-modulated voltage with a duty ratio of $PWM_2=66\%$ being applied to the winding W. For the winding U, the voltage measurement at the tap 19 in FIG. 1 indicates a measurement result of $PWM_{meas}$=0%. In other words, a measurement result of $PWM_{meas}$=0% identifies that this relates to a switched-on defective switch 16 with a connection to the negative supply voltage, which is associated with the winding U that is not being driven.

As already mentioned, the method is repeated, since, initially, it is not known which winding U, V, W the defective switch 11, 12, 13, 14, 15, 16 is associated with, and, in consequence, it is not directly possible to also drive the two windings U, V, W which are not associated with the defective switch 11, 12, 13, 14, 15, 16. Therefore, initially, two of the three windings U, V, W are driven, and, if the identification unit once again identifies a defect, the method is terminated, with two others of the three windings U, V, W being driven when the method is restarted. This repetition will be explained in more detail with reference to the flow chart in FIG. 5. Initially, a fault counter Z is set to zero. The value of the fault counter Z is incremented by the amount "1" when the identification unit A has identified a defect. The flowchart illustrated in FIG. 5 assumes that the identification unit A has identified a defect in one of the switches 11, 12, 13, 14, 15, 16. The fault counter is incremented by one value in method step 21: Z=Z+1.

In method step 22, all the switches 11, 12, 13, 14, 15, 16 are opened, thus resulting in being in the open switch position. A check is then carried out in method step 23 and a distinction is drawn based on the value of the fault counter Z. In the present case, the value of the fault counter is Z=1 and the winding V has a pulse-width-modulated voltage with a duty ratio of $PWM_1$=33% applied to it, and $PWM_2$=66% is applied to the winding W (method step 24). The voltage across the winding U will be measured later. Method step 25 now checks whether the identification unit A still identifies a defective switch 11, 12, 13, 14, 15, 16. This is an indication that the defective switch 11, 12, 13, 14, 15, 16 is associated with one of the driven windings V, W. If the identification unit A identifies a defect, the method is terminated, and the fault counter is incremented by one value in method step 21. If the identification unit A does not identify a defect, the defective switch 13, 16 is associated with the winding U which is not being driven. In method step 26, the voltage $PWM_{meas}$ across the winding U is measured and a distinction is drawn between the situations described in FIGS. 2 to 4: If there is a voltage of $PWM_{meas}$=0% across the winding U, then a switched-on defective switch 16 with a connection to the negative supply voltage is identified (method step 27), which is associated with the winding U. This corresponds to the defect $F_3$, which was described with reference to FIG. 4. If, in contrast, the measurement result is $PWM_{meas}$=100%, then method step 28 identifies a switched-on defective switch 13 with a connection to the positive supply voltage, which is associated with the winding U. This corresponds to the defect $F_2$, which was described with reference to FIG. 3. In both cases, the defective switch 13, 16 can be opened by deliberately thermally overloading it, or a fuse, which is not illustrated, is blown. The electric motor is then operated in an emergency mode, as provided in method step 30.

In contrast, if a measurement result 33%<$PWM_{meas}$<66%, that is to say a measurement result between 33% and 66%, is determined, then the defect is a switched-off defective switch 13, 16, which is associated with the winding U. This is the defect $F_1$, which was described with reference to FIG. 2. As already mentioned, the electric motor 1 can be operated in an emergency mode in this case.

If the identification unit A identified a defect in method step 25, then this must relate to a switch 11, 12, 14, 15 in the driven windings V, W. The fault counter Z is therefore incremented by one value in method step 21, and all the switches 11, 12, 13, 14, 15, 16 are opened in method step 22. The check of the value of the fault counter leads with a value of Z=2 to method step 31. In this method step 31, a pulse-width-modulated voltage with a duty ratio of $PWM_1$=33% is applied to the winding U, and the duty ratio of $PWM_2$=66% is applied to the winding W. The voltage across the winding V is then measured. Method step 32 checks whether the identification unit A has identified a defect. If not, the voltage across the winding V is measured in method step 33 and, in the event of a measurement result of $PWM_{meas}$=0%, the defect $F_3$ is identified, that is to say a switched-on defective switch 14 with a connection to the negative supply voltage, which is associated with the winding V (method step 34). If the measurement result in method step 35 is $PWM_{meas}$=100%, the defect $F_2$ is identified, that is to say a switched-on defective switch 11 with a connection to the positive supply voltage, which is associated with the winding V. In addition, if the measurement result $PWM_{meas}$ is between 33% and 66%, the defect $F_1$ is identified, that is to say a switched-off defective switch 11, 14, which is associated with the winding V (method step 36). In any case, emergency operation of the electric motor 1 can be started in step 37—in the two situations mentioned first of all only after the switched-on defect has been opened.

Figure 5:
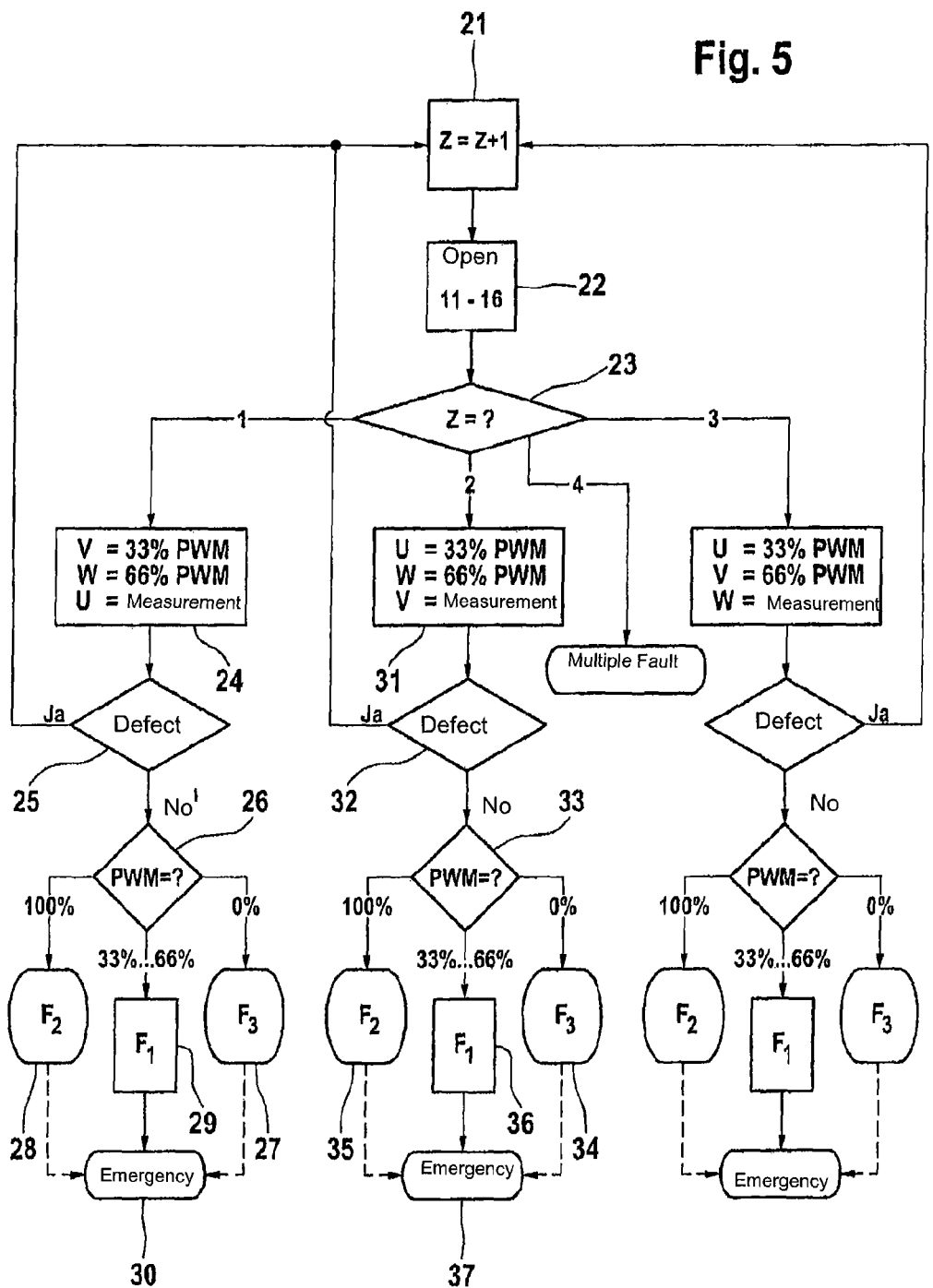
FIG. 5 shows a flow chart of the method according to aspects of the invention.

If a further defect was identified in method step 32, the method jumps back to method step 21 and increments the fault counter Z by the value "1". The method jumps back to method step 21 because the identification unit A has a identified a defect in a switch 12, 13, 15, 16, which are associated with the driven windings U and W. In consequence, the value of the fault counter is now Z=3, and the method is repeated, as is illustrated in FIG. 5. The only difference is that the winding U and the winding V are now driven, since the defective switch 12, 15 must now be that switch 12, 15 which is associated with the winding W, since the winding W is the last of the three windings U, V, W on which no voltage measurement has yet been carried out, while the other windings U, V have been driven.

If the identification unit A also identifies a switch defect in this case, then a multiple fault is present, in which a plurality of switches 11, 12, 13, 14, 15, 16 are defective. The method jumps back to method step 21, and the fault counter is incremented by the value "1". The value of the fault counter is therefore Z=4, This value of the fault counter Z indicates that not just one switch 11, 12, 13, 14, 15, 16 is defective, but a plurality of the switches 11, 12, 13, 14, 15, 16. The electric motor 1. is switched off if a multiple fault is present.

The advantage of the described method is that, after tracing and identification of the defect $F_1$, $F_2$, $F_3$, emergency operation of the electric motor 1 can be started if required, provided that the switch 11, 12, 13, 14, 15, 16 is not defectively switched on, or the electric motor 1 can be switched off, or deactivation of a defectively switched on switch 11, 12, 13, 14, 15, 16 can be initiated, either by deliberately thermally overloading it or by blowing a fuse. This also requires the information as to whether the defective switch 11, 12, 13, 14, 15, 16 is associated with the positive or the negative supply side. After this deactivation of the defective switch 11, 12, 13, 14, 15, 16, emergency operation of the electric motor 1 can likewise be started.

The described method is distinguished in particular by there being no need for any current sensors for tracing and identification of a defective switch 11, 12, 13, 14, 15, 16, thus reducing the costs. A further advantage is that emergency operation of the electric motor 1 is possible in the event of a fault, thus increasing the availability of the electric motor 1, which is advantageous in safety-critical applications, such as electromechanical steering. The defective switch 11, 12, 13, 14, 15, 16 can be identified comparatively quickly, thus allowing a sufficiently fast reaction to be carried out in safety-critical applications.

The invention claimed is:

1. A method for operating a brushless electric motor whose windings (U, V, W) are driven by an inverter with the aid of six switches, with an identification unit (A) being provided in order to identify defective switches, with a unit (B) being provided for voltage measurement at the outputs of the inverter, and with a microcontroller (C) being provided for controlling the switches, the method comprising the steps of:

tracing the winding (U, V, W) which is affected by a defect ($F_1$, $F_2$, $F_3$);

determining the nature of the defect ($F_1$, $F_2$, $F_3$) in the switches by using respective different voltages ($PWM_1$, $PWM_2$) to drive those windings (V, W) which are not associated with the defective switch, while measuring a voltage on the winding (U) which is associated with the defective switch.

2. The method as claimed in claim 1, wherein the winding (U) which is associated with the defective switch is connected to the unit (B) for voltage measurement.

3. The method as claimed in claim 1, wherein the nature of the defect ($F_1$, $F_2$, $F_3$) is a switch which is blocked in the open or closed switch position.

4. The method as claimed in claim 1, further comprising the following steps:

identifying a defective switch by the identification unit (A);

opening of all the switches;

driving the windings (V, W) which are not associated with the defective switch with the respective different voltages ($PWM_1$, $PWM_2$) and measuring and evaluating the voltage which is applied to the winding (U) which is associated with the defective switch.

5. The method as claimed in claim 4, wherein a winding (V) which is not associated with the defective switch has a pulse-width-modulated voltage ($PWM_1$) applied to it, which has a duty ratio of 1/3=33%, while the other winding (W) which is likewise not associated with the defective switch has a pulse-width-modulated voltage ($PWM_2$) applied to it which has a duty ratio of 2/3=66%.

6. The method as claimed in claim 5, wherein the switch is identified as defective in the open switch position if the measurement result ($PWM_{meas}$) of the pulse-width-modulated voltage on the winding (U) which is associated with the defective switch indicates a duty ratio between 33% and 66%.

7. The method as claimed in claim 5, wherein the switch is identified as being defective in the closed switch position with a connection to the positive supply voltage if the measurement result ($PWM_{meas}$) of the pulse-width-modulated voltage on the winding (U) which is associated with the defective switch indicates a duty ratio of 100%.

8. The method as claimed in claim 5, wherein the switch is identified as defective in the closed switch position with a connection to the negative supply voltage if the measurement result ($PWM_{meas}$) of the pulse-width-modulated voltage on the winding (U) which is associated with the defective switch indicates a duty ratio of 0%.

9. The method as claimed in claim 4, wherein the method steps are repeated, with different windings (U, V, W) being driven, until the defect ($F_1$, $F_2$, $F_3$) has been traced or a multiple fault is identified, in which a plurality of switches are defective.

10. The method as claimed in claim 1, wherein the defective switch is opened by deliberate thermal overloading in the situation in which the defective switch is blocked in the switched-on state.

11. The method as claimed in claim 1, wherein a fuse is blown if the defective switch is blocked in the closed switch position.

12. The method as claimed in claim 1, wherein the electric motor is switched off or is operated in an emergency mode.

\* \* \* \* \*